(12) United States Patent
Fossum et al.

(10) Patent No.: US 8,976,277 B2
(45) Date of Patent: Mar. 10, 2015

(54) IMAGE SENSORS

(75) Inventors: Eric R. Fossum, Wolfeboro, NH (US);
Soo-Jung Hwang, Gunpo-si (KR);
Young-Gu Jin, Hwaseong-si (KR);
Yoon-Dong Park, Yongin-si (KR);
Dae-Kil Cha, Suncheon-si (KR)

(73) Assignee: Samsung Electronics Gyeonggi-do (KR)

( * ) Notice: Subject to any disclaimer, the term of this patent is extended or adjusted under 35 U.S.C. 154(b) by 834 days.

(21) Appl. No.: 12/887,258

(22) Filed: Sep. 21, 2010

(65) Prior Publication Data

US 2011/0074989 A1 Mar. 31, 2011

(30) Foreign Application Priority Data

Sep. 25, 2009 (KR) .................. 10-2009-0091113

(51) Int. Cl.
*H04N 3/14* (2006.01)
*H04N 5/369* (2011.01)
*H01L 27/146* (2006.01)
*H04N 5/225* (2006.01)
*H04N 5/33* (2006.01)

(52) U.S. Cl.
CPC ........ *H04N 5/3696* (2013.01); *H01L 27/14621* (2013.01); *H01L 27/14645* (2013.01); *H04N 5/2257* (2013.01); *H04N 5/332* (2013.01)
USPC .......................................... 348/294; 348/302

(58) Field of Classification Search
USPC .......................................... 348/294, 302, 311
See application file for complete search history.

(56) References Cited

U.S. PATENT DOCUMENTS

| | | | |
|---|---|---|---|
| 6,584,283 B2 * | 6/2003 | Gabello et al. ................. | 396/109 |
| 7,864,233 B2 * | 1/2011 | Kwon et al. ................... | 348/272 |
| 7,915,652 B2 * | 3/2011 | Lee et al. ....................... | 257/291 |
| 2002/0063302 A1 * | 5/2002 | Furumiya et al. ............. | 257/432 |
| 2005/0061980 A1 * | 3/2005 | Iida et al. ..................... | 250/338.4 |
| 2008/0173794 A1 * | 7/2008 | Oike et al. ................. | 250/208.1 |
| 2008/0218597 A1 * | 9/2008 | Cho ............................ | 348/222.1 |
| 2010/0020209 A1 * | 1/2010 | Kim .............................. | 348/294 |
| 2011/0205412 A1 * | 8/2011 | Miyazaki et al. ............. | 348/294 |

FOREIGN PATENT DOCUMENTS

| | | |
|---|---|---|
| JP | 2008-098436 A | 4/2008 |
| JP | 2008-288243 A | 11/2008 |
| KR | 10-0800310 A | 8/2007 |

* cited by examiner

*Primary Examiner* — James Hannett
(74) *Attorney, Agent, or Firm* — Harness, Dickey & Pierce, P.L.C.

(57) ABSTRACT

Provided is an image sensor having a depth sensor. The image sensor includes a substrate including a visible light region and a non-visible light region, a first well and a second well having a first conductivity type and in the non-visible light perception region, and a first gate and a second gate configured to receive voltages of opposite phases, respectively, and apply voltages to the first well and the second well, respectively.

19 Claims, 16 Drawing Sheets

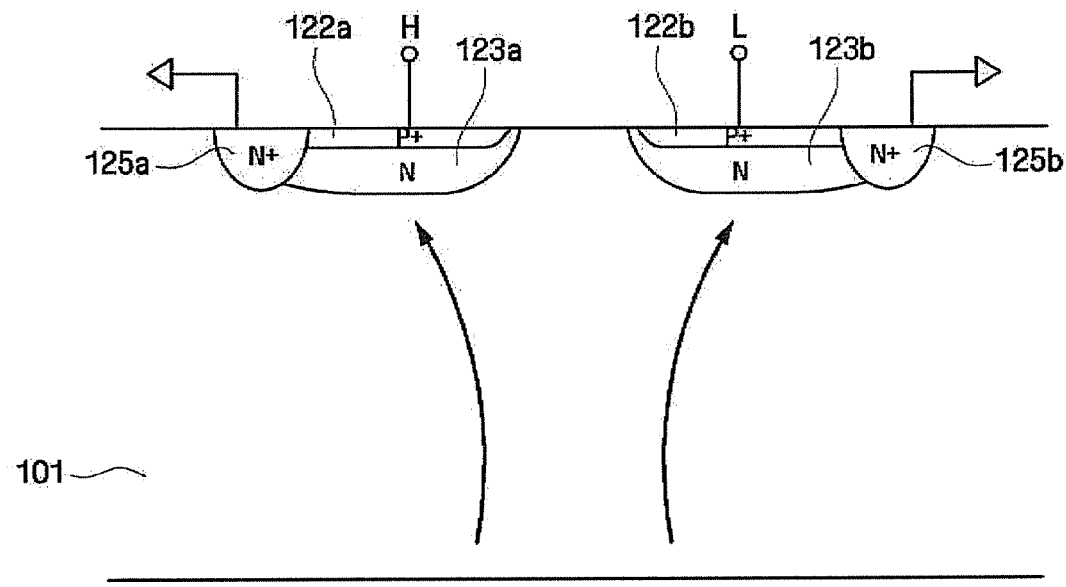
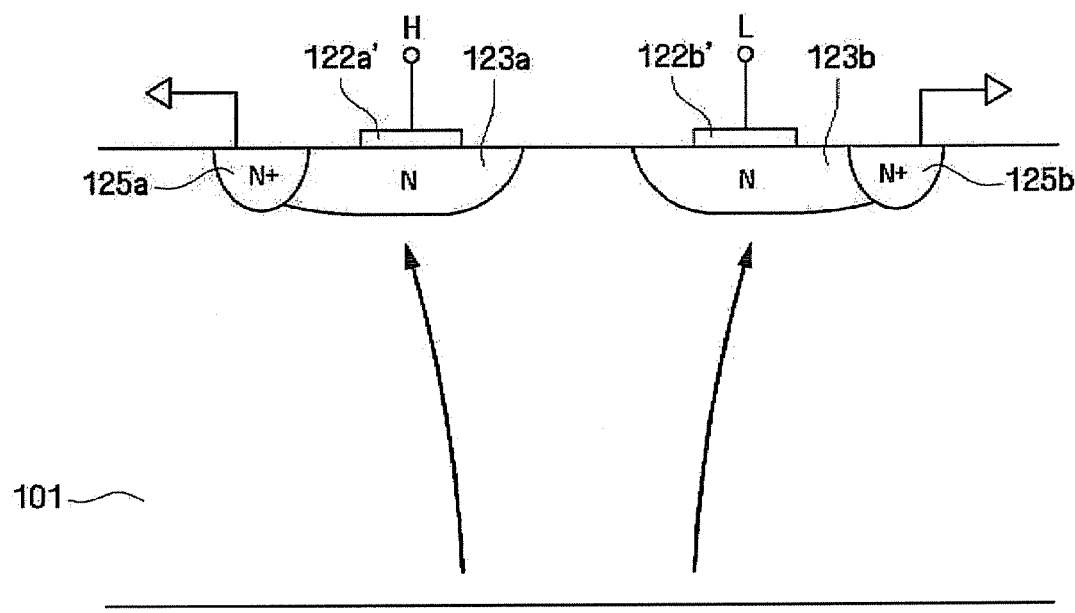

IMAGE SENSORS

This application claims priority under 35 U.S.C. §119 to Korean Patent Application No. 10-2009-0091113 filed on Sep. 25, 2009 in the Korean Intellectual Property Office, the entire contents of which are incorporated herein by reference in its entirety.

BACKGROUND

1. Field

Example embodiments relate to an image sensor having a depth sensor.

2. Description of the Related Art

Image sensors convert an optical image into an electrical signal. With recent advancements in computer and communication industries, the demand for image sensors with enhanced performance is increasing in various fields such as digital cameras, camcorders, personal communication systems, game devices, security cameras, micro-cameras for medical use, and robots.

In particular, metal oxide semiconductor (MOS) image sensors can be driven using a simple driving method and can be implemented using various scanning methods. In MOS image sensors, signal-processing circuits can be integrated onto a single chip. Thus, the size of a product including such a MOS image sensor can be reduced. In addition, since MOS image sensors are compatible with MOS processing technology, manufacturing costs can be reduced. Due to their very low power consumption, MOS image sensors can be applied in products with limited battery capacity. That is, technological development accompanied by achievement of high resolution is sharply increasing the use of MOS image sensors.

SUMMARY

Image sensors can perceive planar image information of an object but cannot perceive the distance between themselves and the object. Thus, image sensors are elements that perceive mostly two-dimensional (2D) images of objects. However, the recent interest in three-dimensional (3D) images is increasing the demand for image sensors which can perceive 3D images of objects. Accordingly, this has led to the need for the development of image sensors which can perceive depth information of each pixel of the 2D image.

Aspects of example embodiments provide an image sensor having a depth sensor, the image sensor capable of perceiving depth information as well as image information of an object.

However, aspects of example embodiments are not restricted to those set forth herein. The above and other aspects of example embodiments will become more apparent to one of ordinary skill in the art to which example embodiments pertain by referencing the detailed description of example embodiments given below.

According to an aspect of example embodiments, there is provided an image sensor. The image sensor includes a substrate having a visible light region and a non-visible light region, a first well and a second well having a first conductivity type, the first well and the second well being in the non-visible light region, and a first gate and a second gate configured to receive voltages of opposite phases, respectively, and apply voltages to the first well and the second well, respectively.

According to another aspect of example embodiments, there is provided an image sensor. The image sensor includes a substrate, a first gate on or in the substrate and configured to receive a first signal, a second gate on or in the substrate and configured to receive a second signal having an opposite phase of a phase of the first signal, a first well having a first conductivity type and being overlapped by the first gate, a second well having the first conductivity type and being overlapped by the second gate, and a third well having the first conductivity type and in the substrate.

BRIEF DESCRIPTION OF THE DRAWINGS

The above and other aspects and features of example embodiments will become more apparent by describing in detail example embodiments thereof with reference to the attached drawings, in which:

FIGS. 8A and 8B are schematic cross-sectional views of a depth sensor included in an image sensor according to an example embodiment of inventive concepts;

DETAILED DESCRIPTION OF EXAMPLE EMBODIMENTS

Figure 1:
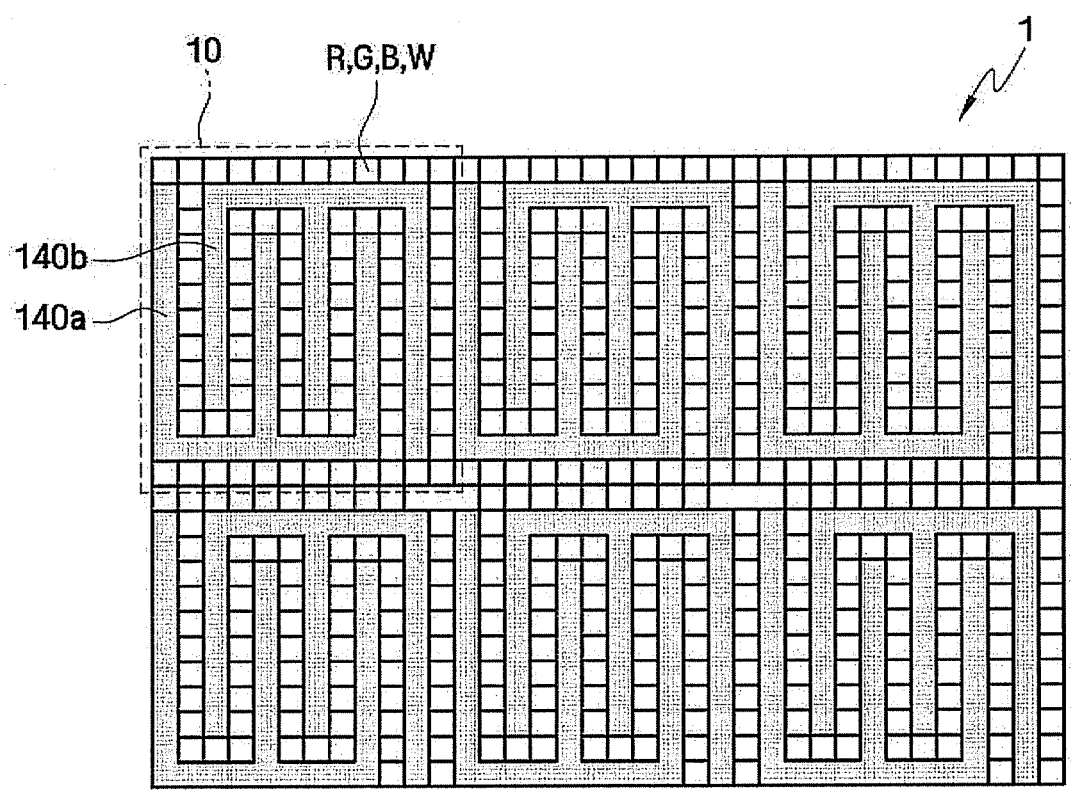
FIG. 1 is a layout diagram of color filters and black filters in an image sensor according to an example embodiment of inventive concepts.

Advantages and features of example embodiments and methods of accomplishing the same may be understood more readily by reference to the following detailed description of example embodiments and the accompanying drawings. Example embodiments may, however, be embodied in many different forms and should not be construed as being limited to the embodiments set forth herein. Rather, these embodiments are provided so that this disclosure will be thorough and complete and will fully convey concepts of example embodiments to those skilled in the art, and example embodiments will only be defined by the appended claims. In the drawings, sizes and relative sizes of layers and regions may be exaggerated for clarity.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises," "comprising," "includes, and/or "including," when used in this specification, specify the presence of stated components, steps, operations, and/or elements, but do not preclude the presence or addition of one or more other components, steps, operations, elements, and/or groups thereof. As used herein, the term "and/or" includes any and all combinations of one or more of the associated listed items. Like numbers refer to like elements throughout.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of example embodiments.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Example embodiments are described herein with reference to (plan and) cross-section illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Figure 2A:
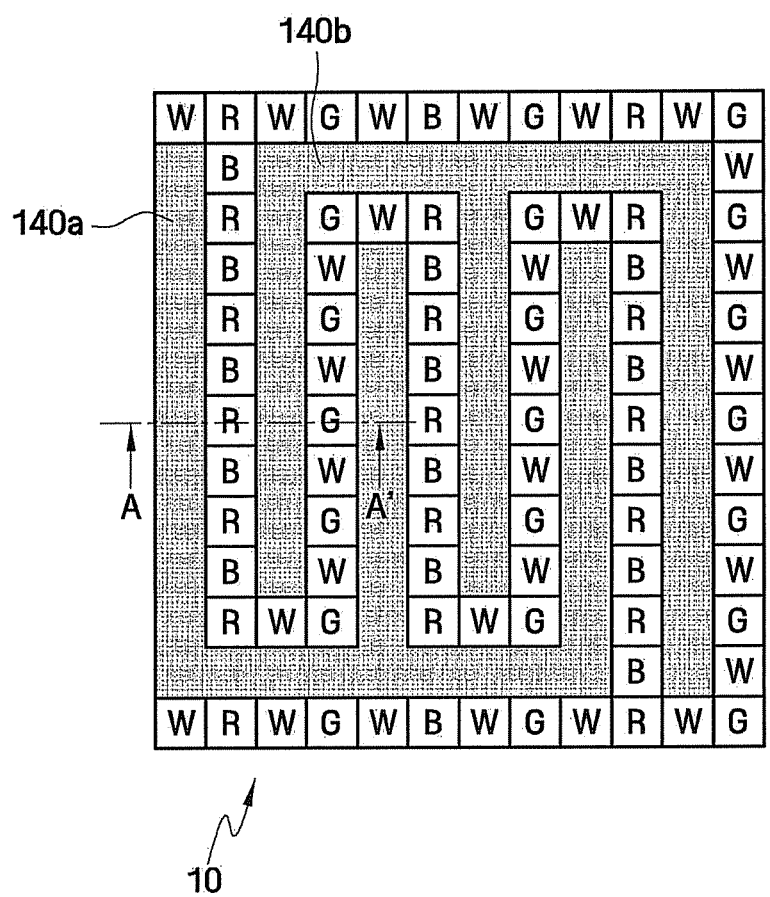
FIG. 2A is an enlarged layout diagram of a unit region of the color filters and the black filters shown in FIG. 1.

Referring to FIGS. 1 and 2A, an image sensor 1 according to an example embodiment of inventive concepts includes a plurality of unit pixels arranged in a matrix form. In addition, a color filter (R, G, B or W) or a black filter 140a or 140b is disposed to correspond to each unit pixel. Color filters (R, G and B) using primary colors such as red, green and blue are illustrated in FIG. 1. However, example embodiments are not limited thereto, and color filters using complementary colors such as yellow, green, magenta and cyan may also be implemented.

A unit pixel is formed under each of red, green, and blue filters R, G, and B to correspond to each of the red, green, and blue filters R, G, and B. Each of the red, green, and blue filters R, G, and B transmits light of a wavelength corresponding to its color. For example, each red filter R allows only red light to pass therethrough, and red light is incident upon a unit pixel overlapped by each red filter R. Each of the red, green and blue filters R, G and B may transmit part of light in a non-visible light region in addition to light of a wavelength corresponding to its color among light in a visible light region.

Light incident through each of the red, green, and blue filters R, G, and B is converted into image information. A region overlapped by each of the red, green, and blue filters R, G, and B is a visible light perception region I (see FIG. 3) as well as an image perception region. The visible light perception region I may include white filters W. Each white filter W is a filter that passes white visible light. The white filters W can increase sensitivity by increasing the amount of light input to the visible light perception region I.

The image sensor 1 includes the black filters 140a and 140b disposed between the color filters R, G, B, and W. The black filters 140a and 140b transmit the non-visible light region while blocking the visible light region. The non-visible light region may be, e.g., infrared light having a longer wavelength than visible light. Each of the black filters 140a and 140b may be a kind of a cut-off filter which transmits light of a predetermined wavelength, for example, a wavelength of 850 nm.

Each of the black filters 140a and 140b may overlap a plurality of unit pixels. Light incident through each of the black filters 140a and 140b can be used to perceive depth information of each image. That is, a region overlapped by each of the black filters 140a and 140b is a non-visible light perception region II as well as a depth perception region. The process of obtaining depth information by using light incident through the black filters 140a and 140b will be described in detail later.

The image sensor 1 includes a plurality of unit regions 10, each having image perception regions and depth perception regions. Each of the unit regions 10 may be a basic unit of pixels for depth perception. That is, the same depth data value may be input to the depth perception regions in each of the unit regions 10.

Each of the unit regions 10 may include a plurality of color filters R, G, B, and W. That is, each of the unit regions 10 includes a plurality of pixels for image perception, and different image data values may be input to the image perception regions in each of the unit regions 10.

In other words, the basic unit area of image perception region may be different from that of distance perception region. For example, while the unit pixels in each of the unit regions 10 have the same depth data, they may have different pieces of image data. The depth data in each of the unit regions 10 may also be converted into different pieces of depth data through correction, and the difference pieces of depth data may be input respectively to the unit pixels.

Referring to FIG. 2A, a plurality of color filters R, G, B, and W may be disposed between the two black filters 140a and 140b. Each of the black filters 140a and 140b may be shaped like a rake having a plurality of teeth. The teeth of the rake-shaped black filters 140a and 140b may be arranged in an alternating manner. One black filter may be formed for each of the color filters R, G, B, and W.

Figure 2B:
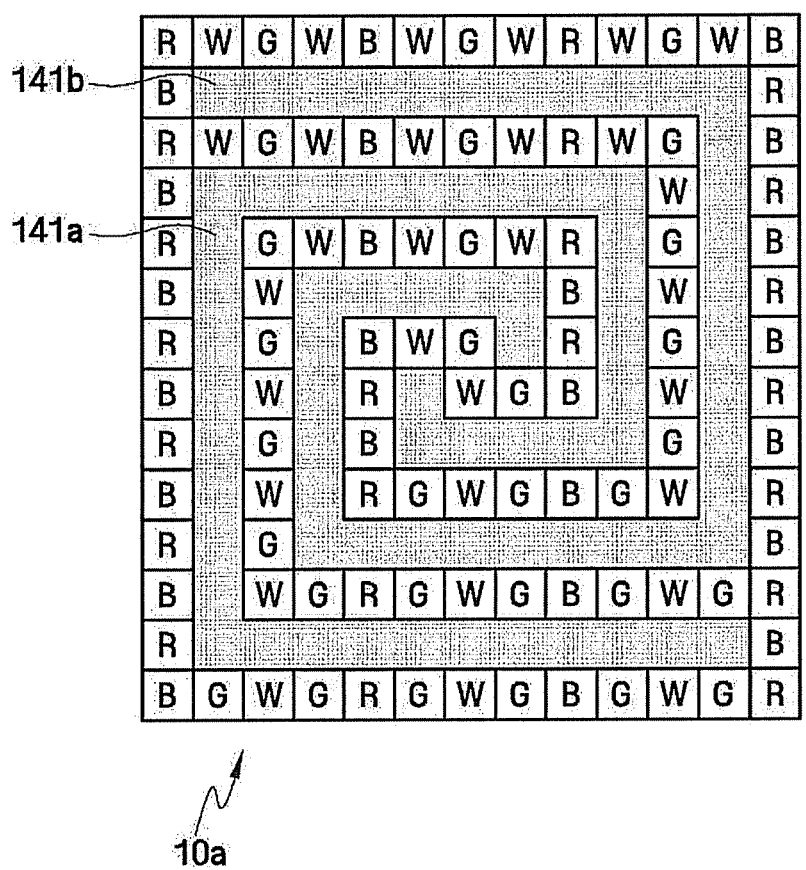
FIGS. 2B and 2C are layout diagrams illustrating modified example embodiments of the unit region shown in FIG. 2A.
Figure 2C:
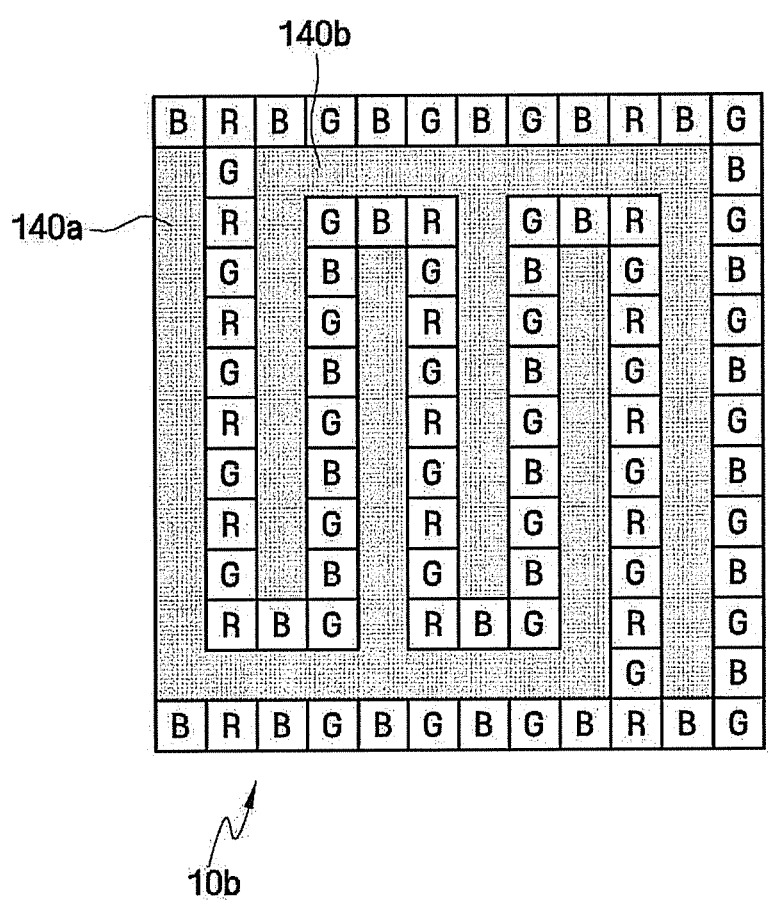

FIGS. 2B and 2C are layout diagrams illustrating modified example embodiments of the unit regions 10 shown in FIG. 2A.

Referring to FIG. 2B, a unit region 10a includes two black filters 141a and 141b which are wound around each other in a spiral shape. Here, the spiral shape may be a circle whose radius is gradually reduced toward a central point or may be a square which converges on a central point as shown in FIG. 2B.

Referring to FIG. 2C, each of the black filters 140a and 140b may be shaped like a rake having a plurality of teeth. The teeth of the rake-shaped black filters 140a and 140b may be arranged in an alternating fashion. Here, color filters disposed between the black filters 140a and 140b may include the red, green, and blue filters R, G, and B but may not include the white filters W shown in FIG. 2A. That is, the white filters W may be omitted when a sufficient amount of light is input to a unit region 10b.

Figure 3:
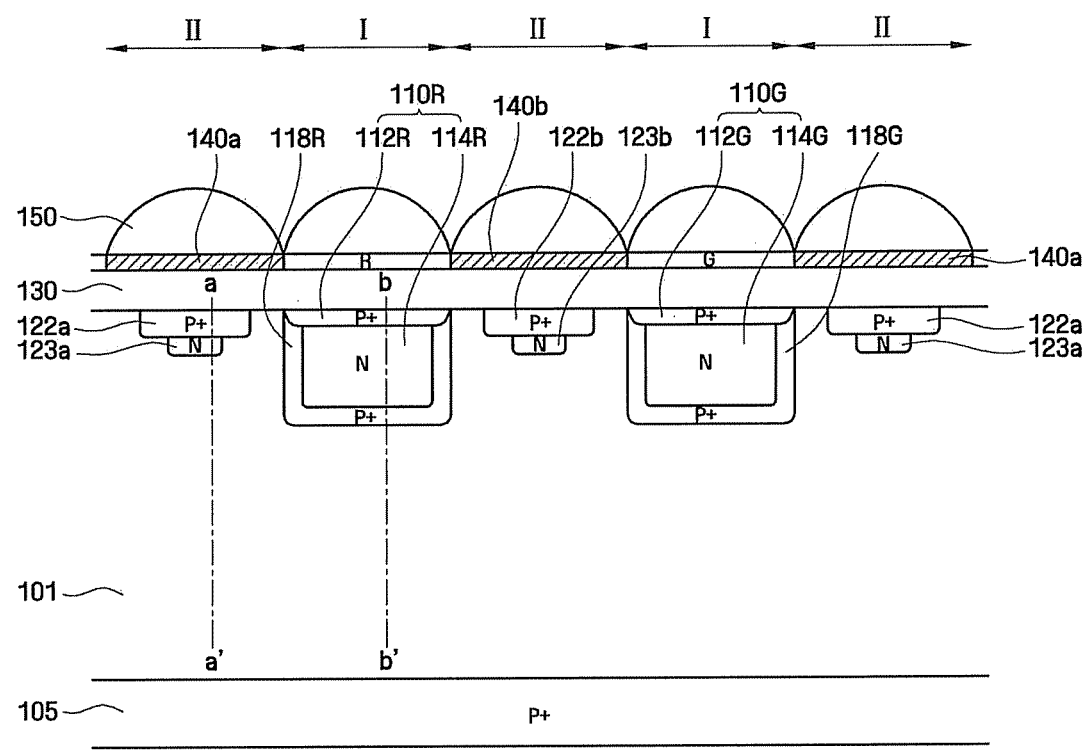
FIG. 3 is a cross-sectional view of the image sensor taken along the line A-A' of FIG. 2A.

The image sensor 1 of FIG. 1 will now be described in detail with reference to FIGS. 2A and 3. FIG. 3 is a cross-sectional view of the image sensor 1 taken along the line A-A' of FIG. 2A.

The image sensor 1 includes a substrate 101 in which the visible light perception region I and the non-visible light perception region II are defined. The visible light perception region I includes a plurality of unit pixels to perceive visible light. Red light, green light, blue light, or white light may be input to each pixel of the visible light perception region I. As described above, white light incident regions may be excluded from the visible light perception region I, and complementary color light may be used instead of primary color light.

The non-visible light perception region II may be formed between portions of the visible light perception region I and may perceive non-visible infrared light having a longer wavelength than visible light. A ratio of the visible light perception region I to the non-visible light perception region II may be adjusted. The non-visible light perception region II can perceive light of a particular wavelength (e.g., 850 nm) among non-visible light. For example, when modulated light having a certain wavelength is used, the depth between the image sensor 1 and an object can be easily and accurately measured.

First and second wells 123a and 123b of a first conductivity type (e.g., an N type) are formed in the substrate 101 of the non-visible light perception region II. The first well 123a and the second well 123b are separated from each other and serve as charge storage regions in which photocharges gather. Photocharges generated by non-visible light gather in the first well 123a and the second well 123b, and the depth of an object from the image sensor 1 is measured using the photocharges.

A first gate 122a and a second gate 122b are formed on the first well 123a and 123b, respectively. The first gate 122a and the second gate 122b are separated from each other, and voltages of different phases are applied respectively to the first gate 122a and the second gate 122b. For example, voltages applied respectively to the first gate 122a and the second gate 122b may have a phase difference of 180 degrees.

The first and second gates 122a and 122b may be formed by doping the substrate 101 with impurities of a second conductivity type (e.g., a P type). The first gate 122a and the second gate 122b may be overlapped by the black filters 140a and 140b, respectively. In addition, the first well 123a and the second well 123b formed under the first gate 122a and the second gate 122b may be overlapped by the black filters 140a and 140b, respectively.

Photoelectric conversion elements 110R and 110G, for example, photodiodes, are formed between the first gate 122a and the second gate 122b.

The photoelectric conversion elements 110R and 110G are formed in the substrate 101 of the visible light perception region I. The substrate 101 in the visible light perception region I may include the photoelectric conversion elements 110R and 110G and a plurality of gates (not shown) such as a gate of a charge transmission element, a gate of a reset element, a gate of a drive element, and the like.

Various types of substrates may be used as the substrate 101. For example, the substrate 101 may be a P- or N-type bulk substrate, a substrate formed by growing a P- or N-type epitaxial layer on a P-type bulk substrate, or a substrate formed by growing a P- or N-type epitaxial layer on an N-type bulk substrate. In addition, the substrate 101 may not be a semiconductor substrate but may be, e.g., an organic plastic substrate. The substrate 101 may be formed to a thickness of 10 μm or more in view of the wavelength of infrared light input to the non-visible light perception region II.

The photoelectric conversion elements 110R and 110G respectively include pinning layers 112R and 112G, which are formed in an upper region of the substrate 101, and third wells 114R and 114G which are formed under the pinning layers 112R and 112G. The pinning layers 112R and 112G reduce the number of electron-hole pairs thermally generated in the upper region of the substrate 101, thereby reducing dark current. In addition, photocharges generated by light, which is incident through the color filters R, G, B and W, accumulate in the third wells 114R and 114G.

The third wells 114R and 114G may be formed between the first well 123a and the second well 123b in the non-visible light perception region II. Like the first and second wells 123a and 123b, the third wells 114R and 114G may be formed by doping the substrate 101 with impurities of the first conductivity type. The depth of each of the third wells 114R and 114G may vary according to the color of a color filter which overlaps each of the third wells 114R and 114G. For example, each of the third wells 114R and 114G may be deep in a region to which red light having a relatively long wavelength among visible light is input. On the other hand, each of the third wells 114R and 114G may be shallow in a region to which blue light having a relatively short wavelength among the visible light is input.

The third wells 114R and 114G are surrounded respectively by first barrier films 118R and 118G of the second conductivity type. The first barrier films 118R and 118G prevent photocharges generated deep under the substrate 101 from being introduced into the third wells 114R and 114G. The generation of photocharges deep under the substrate 101 is caused by red light having a longer wavelength than visible light, and the generated photocharges are mostly used to measure distance. Therefore, the first barrier films 118R and 118G prevent photocharges generated deep under the substrate 101 from flowing to the third wells 114R and 114G while guiding the photocharges to move to the first and second wells 123a and 123b.

A deep well 105 may be formed in a lower region of the substrate 101. The deep well 105 may form a kind of a potential barrier, which hinders the movement of charges generated deep under the substrate 101, and increase the recombination of electrons and holes.

A buffer film 130 may be formed of a silicon oxide film on the substrate 101, and the color filters R and G and the black filters 140a and 140b may be formed on the buffer film 130. As described above, the color filters R and G respectively overlap the third wells 114R and 114G in the visible light perception region I, and the black filters 140a and 140b respectively overlap the first and second wells 123a and 123b in the non-visible light perception region II. The black filters 140a and 140b may also overlap the first gate 122a and the second gate 122b, respectively.

Microlenses 150 may be formed on the color filters R and G and the black filters 140a and 140b.

A longitudinal potential of the substrate 101 will now be described with reference to FIGS. 4A and 4B.

Figure 4A:
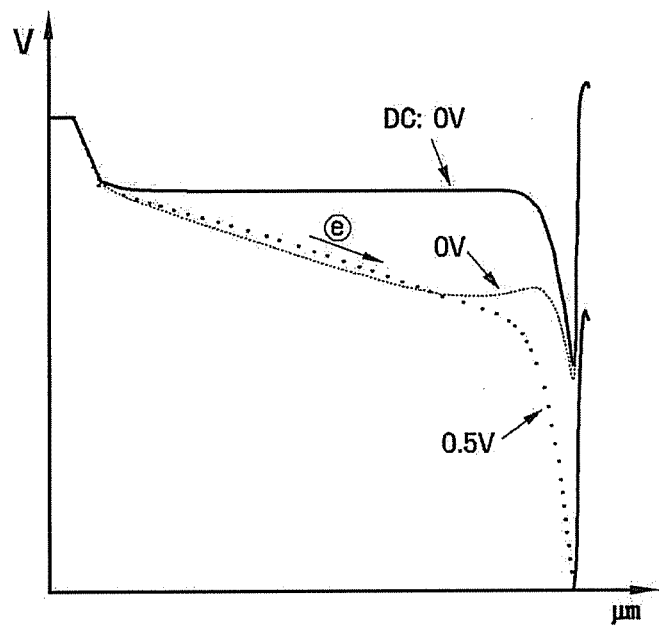
FIG. 4A is a potential diagram taken along the line a-a' of FIG. 3.
Figure 4B:
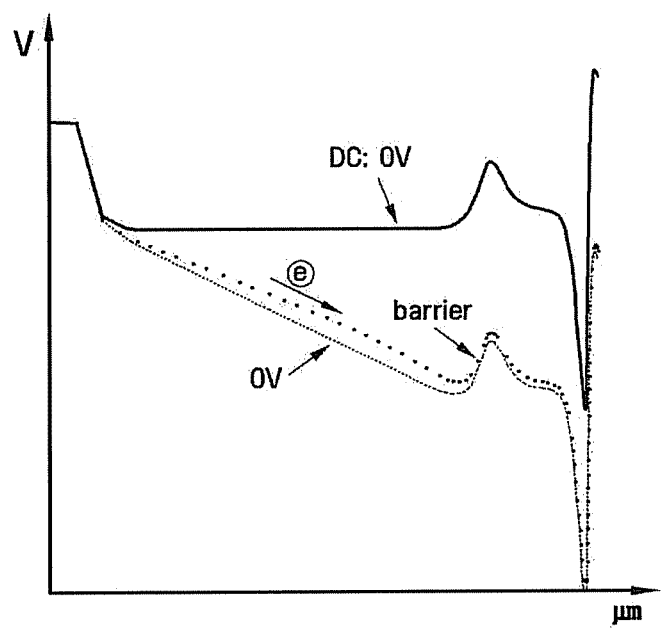
FIG. 4B is a potential diagram taken along the line b-b' of FIG. 3.

FIG. 4A is a potential diagram taken along the line a-a' of FIG. 3, and FIG. 4B is a potential diagram taken along the line b-b' of FIG. 3.

Referring to FIG. 4A, the line a-a' is a longitudinal line passing through the first gate 122a and/or the second gate 122b in the non-visible light perception region II.

When voltages are applied to the first and second gates 122a and 122b, the potential of the non-visible light perception region II slopes. Accordingly, photocharges generated deep under the substrate 101 can easily move to the first well 123a or the second well 123b. In particular, the potential of one of the first and second gates 122a and 122b to which a high voltage is applied slopes more steeply. That is, photocharges converge on one of the first and second gates 122a and 122b to which a high voltage is applied.

Referring to FIG. 4B, the line b-b' is a longitudinal line passing through the photoelectric conversion elements 110R and 110G in the visible light perception region I.

No voltages are applied to the photoelectric conversion elements 110R and 110G in the visible light perception region I. However, the potential of the visible light perception region I has a steep slope in the lower region of the substrate 101. Accordingly, photocharges generated in the lower region of the substrate 101 move toward the photoelectric conversion elements 110R and 110G. Here, the photocharges moved to the photoelectric conversion elements 110R and 110G cannot pass through the potential barriers formed by the first barrier films 118R and 118G. Thus, the photocharges blocked by the first barrier films 118R and 118G move to the first and second wells 123a and 123b in the non-visible light perception region II.

The generation of photocharges deep under the substrate 101 is mostly caused by non-visible light. Thus, the first barrier films 118R and 118G prevent the generated photocharges from moving to the third wells 114R and 114G in the visible light perception region I.

However, since the potential curve inside the first barrier films 118R and 118G has a large slope as illustrated in FIG. 4B, photocharges generated in a shallow area of the substrate 101 can be easily stored in the third wells 114R and 114G.

Figure 5A:
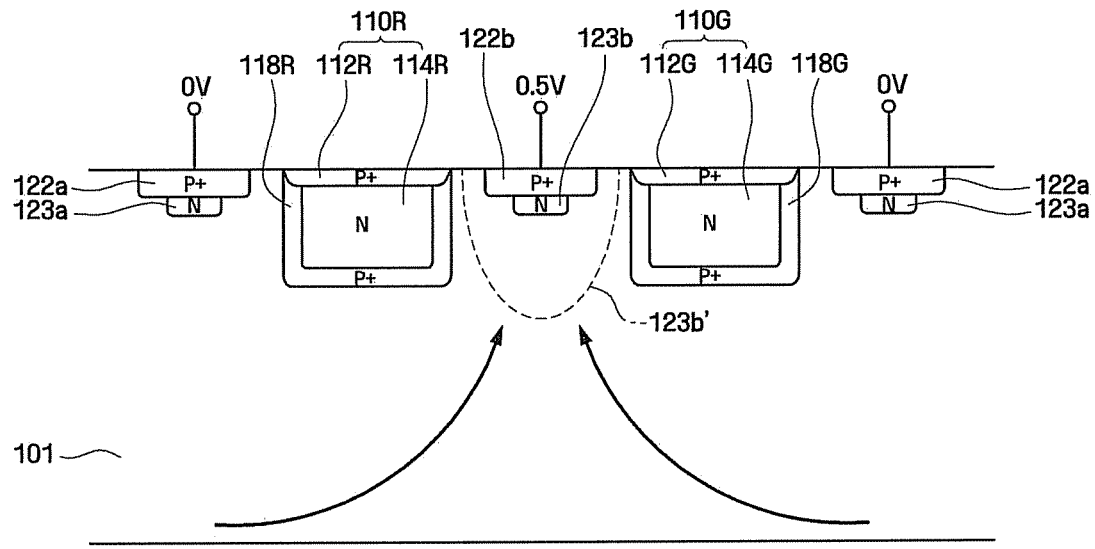
FIGS. 5A and 5B are schematic diagrams illustrating the process of storing charges in a depth sensor included in the image sensor of FIG. 1.
Figure 5B:
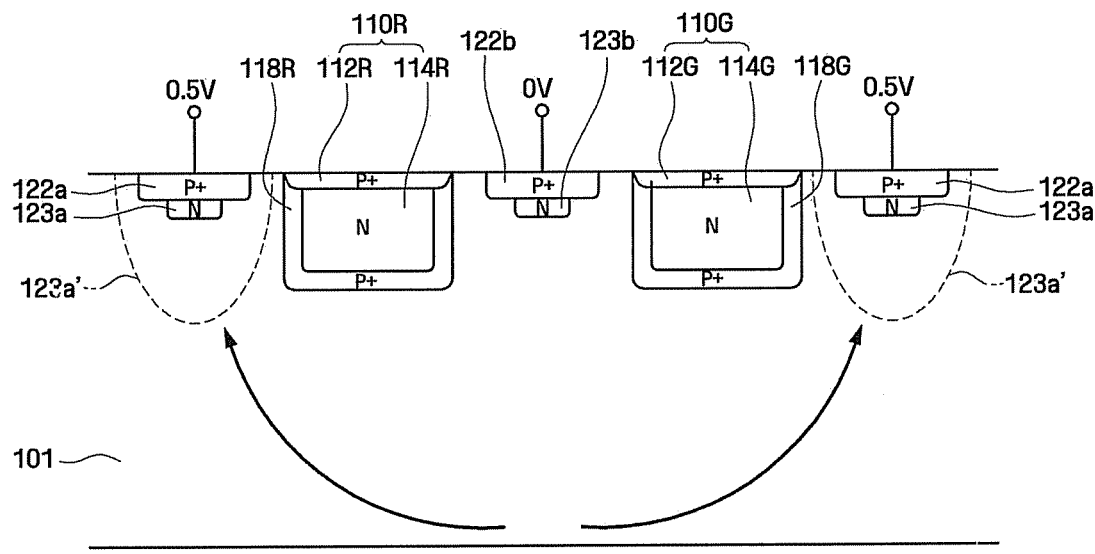

FIGS. 5A and 5B are schematic diagrams illustrating the process of storing charges in a depth sensor included in the image sensor 1 of FIG. 1.

Referring to FIG. 5A, if a high voltage of 0.5 V is applied to the second gate 122b and if a low voltage of 0 V is applied to the first gate 122a, photocharges move to the second well 123b under the second gate 122b. Here, the second well 123b may expand to an expansion region 123b' by the voltage applied to the second gate 122b.

Specifically, non-visible light (such as infrared light) having a longer wavelength than visible light is absorbed deep in the substrate 101, thereby generating photocharges. In fact, the non-visible light may reach not only regions under the first and second gates 122a and 122b but also regions under the photoelectric conversion elements 110R and 110G, thereby generating photocharges. Then, the generated photocharges move along the slope of the potential. Here, the potential has a steep slope toward the second gate 122b to which the high voltage has been applied. Accordingly, the photocharges are stored in the second well 123b under the second gate 122b.

Referring to FIG. 5B, if a high voltage of 0.5 V is applied to the first gate 122a and if a low voltage of 0 V is applied to the second gate 122b, photocharges move to the first well 123a under the first gate 122a. Here, the first well 123a may expand to an expansion region 123a' by the voltage applied to the first gate 122a.

It can be understood from FIGS. 5A and 5B that photocharges are stored in the first well 123a or the second well 123b, depending on voltages applied to the first and second gates 122a and 122b. In fact, voltages applied respectively to the first gate 122a and the second gate 122b have opposite phases and pulse waveforms which are synchronized with modulated light. Thus, photocharges are alternately stored in the first well 123a and 123b, and the depth between the image sensor 1 and an object is perceived using the photocharges. A specific depth perception method will be described later.

Figure 6:
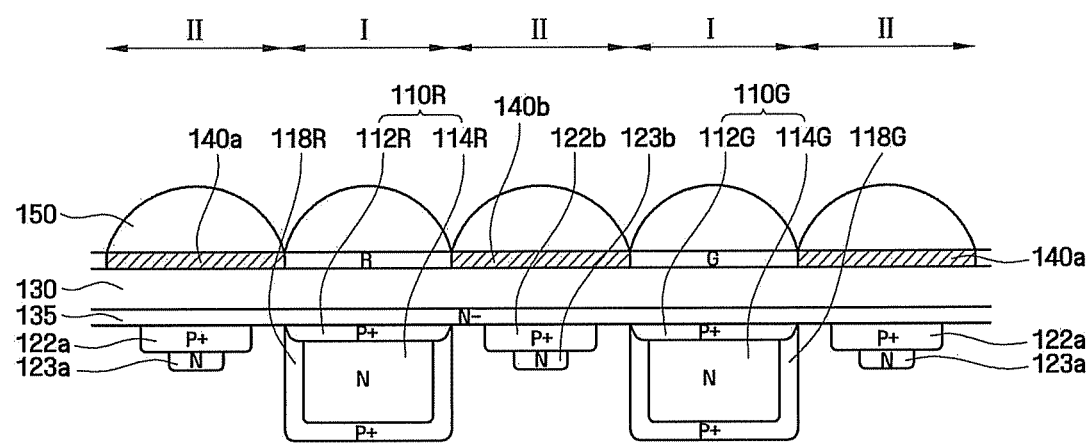
FIG. 6 is a cross-sectional view of an image sensor according to another example embodiment of inventive concepts.

FIG. 6 is a cross-sectional view of an image sensor according to another example embodiment of inventive concepts.

The image sensor according to the current example embodiment is substantially identical to the image sensor 1 according to the embodiment of FIG. 3 except that a second barrier film 135 is further formed on a substrate 101.

The second barrier film 135 may be an N⁻ layer containing a lower concentration of impurities than a first conductivity type (e.g., an N type). The second barrier film 135 can inhibit leakage of current between a first gate 122a and a second gate 122b when voltages are applied to the first gate 122a and the second gate 122b.

Figure 7:
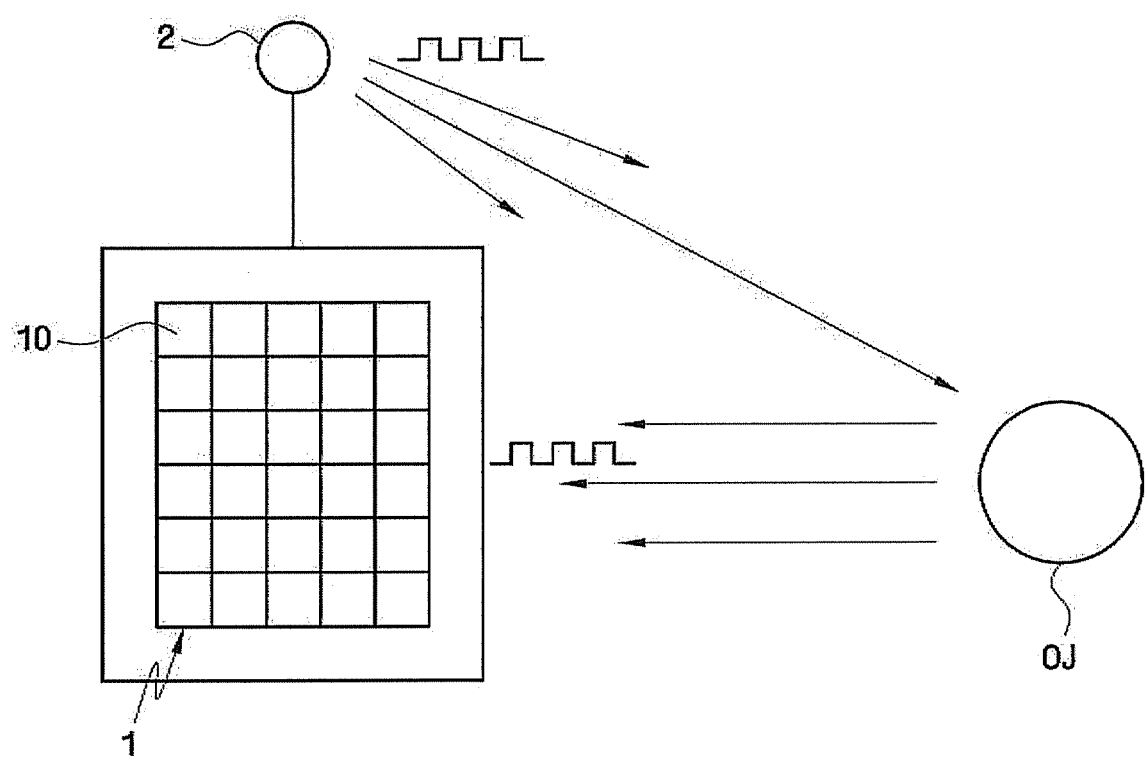
FIG. 7 is a schematic diagram illustrating the image and depth perception process of an image sensor according to an example embodiment of inventive concepts.

FIG. 7 is a schematic diagram illustrating the image and depth perception process of an image sensor 1 according to an example embodiment of inventive concepts.

Referring to FIG. 7, the image sensor 1 may measure the depth between each of unit regions 10 and an object OJ by using each of the unit regions 10 as a basic unit. The unit regions 10 may be arranged in a matrix form in the image sensor 1.

The image sensor 1 is connected to a light source 2 which irradiates light to the object OJ. The light source 2 may be, for example, a light-emitting diode (LED) and may include a filter to irradiate light of a predetermined wavelength.

The light source 2 may be modulated light having a certain wavelength (e.g., 850 nm). That is, modulated light of a certain wavelength has a constant cycle and can be used to measure the depth of the object OJ from the image sensor 1 or the speed of the object OJ.

The light source 2 is synchronized with the image sensor 1 to irradiate light. That is, the depth between the image sensor 1 and the object OJ can be measured by measuring the time when the light source 2 irradiates light to the object OJ and the time when the light arrives at the image sensor 1.

Figure 9A:
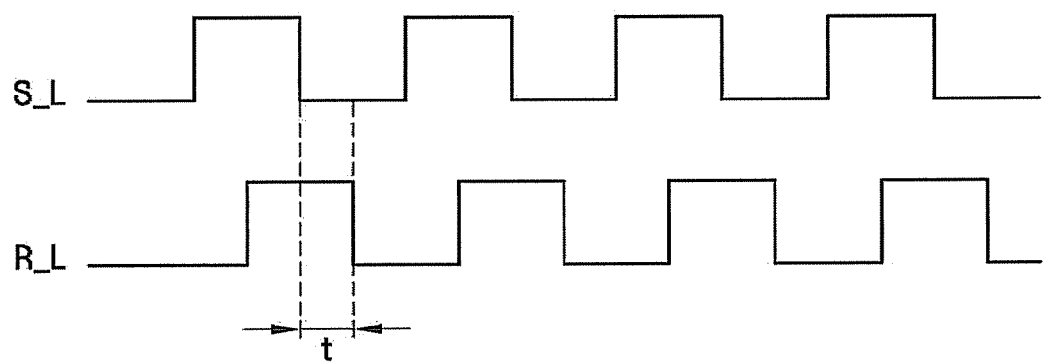
FIGS. 9A and 9B show waveforms of output light and reflected light of modulated light used for depth perception of an image sensor according to an example embodiment of inventive concepts.

FIGS. 8A and 8B are schematic cross-sectional views of a depth sensor included in an image sensor according to an example embodiment of inventive concepts. FIG. 9A shows waveforms of output light S_L and reflected light R_L of modulated light used for depth perception of the image sensor 1 according to an example embodiment of inventive concepts.

Referring to FIG. 8A, a first gate 122a and a second gate 122b are formed in a junction gate structure by doping a substrate 101 with P+ impurities. That is, when power is supplied to the first gate 122a and the second gate 122b, charges are stored in a first well 123a and a second well 123b and then move to a first charge detector 125a and a second charge detector 125b.

Referring to FIG. 8B, a first gate 122a' and a second gate 122b' are patterned on a substrate 101 in a photogate structure. That is, first and second gates included in the image sensor according to the current example embodiment may have the junction gate structure or the photogate structure.

Since the first gate 122a is synchronized with the light source 2 (see FIG. 7), a first signal H having the same waveform as the light source 2 is transmitted to the first gate 122a. Here, a second signal L having an opposite phase to that of the first signal H is transmitted to the second gate 122b.

Referring to FIG. 9A, the output light S_L of the light source 2 is modulated light having a constant waveform. In addition, the light R_L reflected by an object OJ has the same waveform as the output light S_L. However, there is a time delay t or a phase delay between the output light S_L and the reflected light R_L due to the depth of the image sensor 1 from the object OJ. The depth of the object OJ from the image sensor 1 is measured by detecting the time delay t between the output light S_L and the reflected light R_L.

Figure 9B:
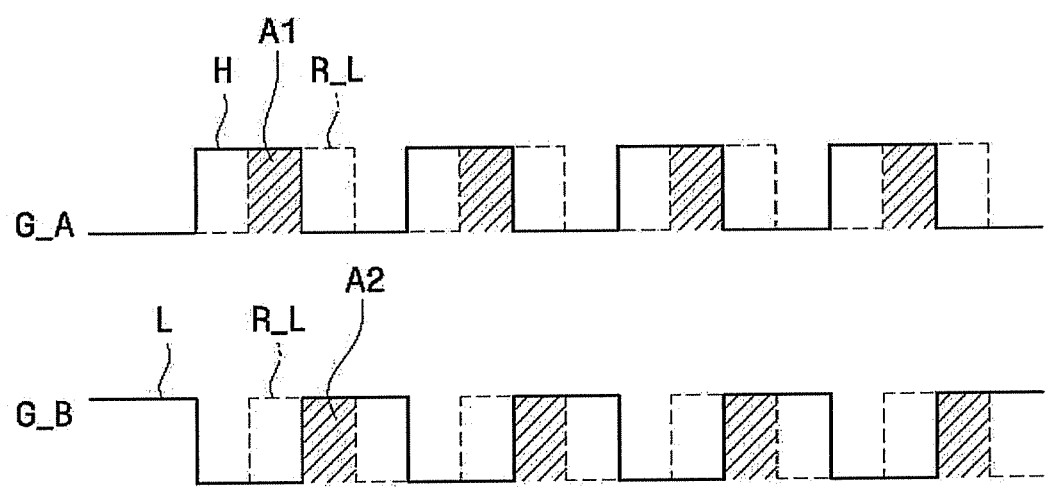

Referring to FIG. 9B, the first signal H input to the first gate 122a and the second signal L input to the second gate 122b have opposite phases. Here, if photocharges stored in the first well 123a and 123b are detected, a virtual waveform which is the same as the waveform of the reflected light R_L can be obtained as illustrated in FIG. 9B. In fact, the virtual waveform which is the same as the waveform of the reflected light R_L can be learned from the sum of photocharge values obtained through the first well 123a and the second well 123b.

Specifically, a photocharge value perceived through the first well 123a is equal to a value A1 of the reflected light R_L which overlaps the first signal H transmitted to the first gate 122a, and a photocharge value perceived through the second well 123b is equal to a value A2 of the reflected light R_L which overlaps the second signal L transmitted to the second gate 122b. That is, the sum of the photocharge values perceived through the first and second wells 123a and 123b is equal to a value of the reflected light R_L actually incident upon the image sensor 1.

Here, a value obtained by dividing the photocharge value of the second well 123b by the photocharge value of the first well 123a is proportional to the depth between the object OJ and the image sensor 1. In this way, a depth value of the object OJ from the image sensor 1 can be calculated. However, the method used to calculate the depth value of the object OJ from the image sensor 1 is not limited to the above method, and various methods can also be used.

Figure 10:
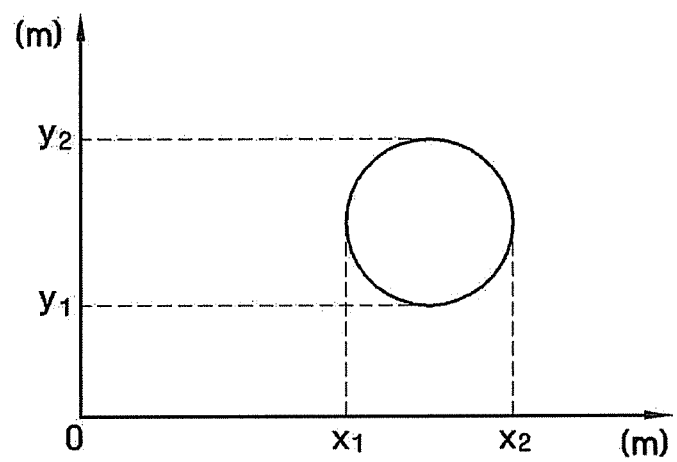
FIG. 10 is a graph illustrating relative coordinates of an object perceived by an image sensor according to an example embodiment of inventive concepts.
Figure 11:
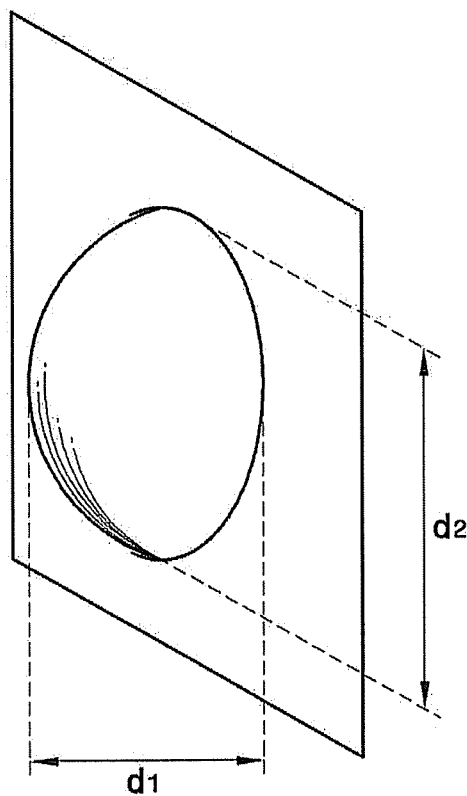
FIG. 11 is a perspective view of an image perceived by an image sensor according to an example embodiment of inventive concepts.

FIG. 10 is a graph illustrating relative coordinates of an object OJ perceived by an image sensor 1 according to an example embodiment of inventive concepts. FIG. 11 is a perspective view of an image perceived by the image sensor 1 according to an example embodiment of inventive concepts.

In FIG. 10, relative coordinates of the object OJ are illustrated. The horizontal axis represents the distance between the object OJ and the image sensor 1, and the vertical axis represents the height of the object OJ.

In FIG. 11, an image of the object OJ of FIG. 10 perceived by the image sensor 1 is shown. The image contains information about a depth d1 as well as a width d2 of the object OJ. Here, the information about the width d2 of the object OJ is proportional to an actual width (y2-y1) of the object OJ, and the depth d1 of the object OJ is proportional to an actual distance (x2-x1) of the object OJ from the image sensor 1.

Figure 12:
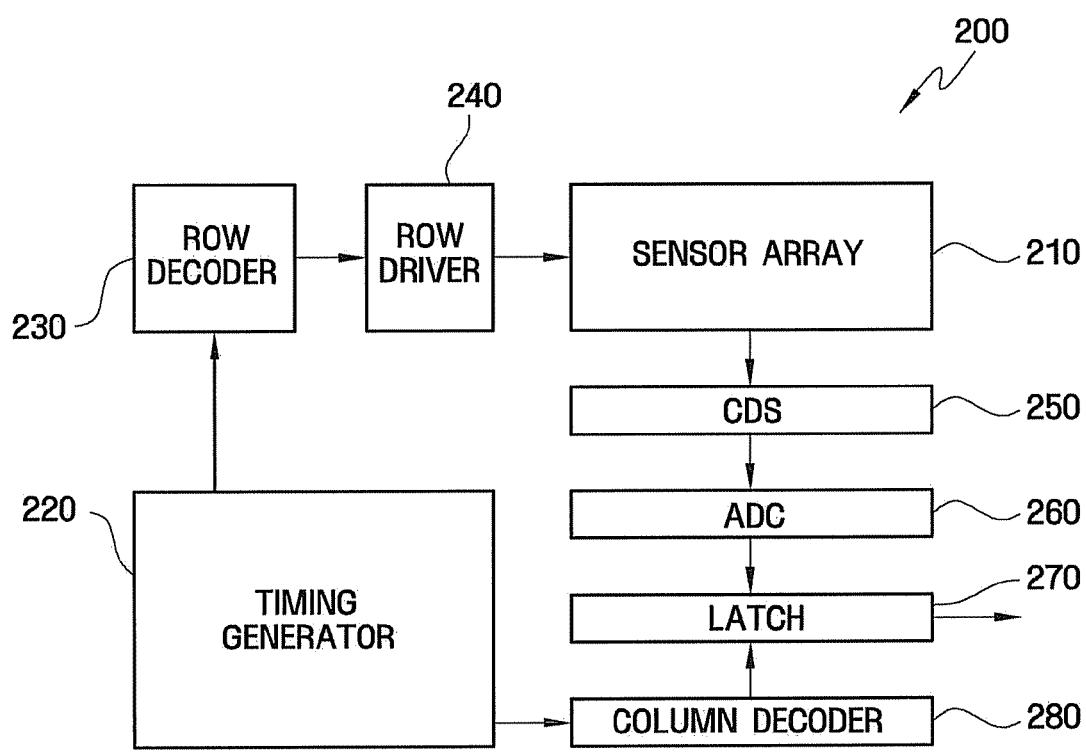
FIG. 12 is a block diagram of a chip which embodies an image sensor according to example embodiments of inventive concepts.
Figure 13:
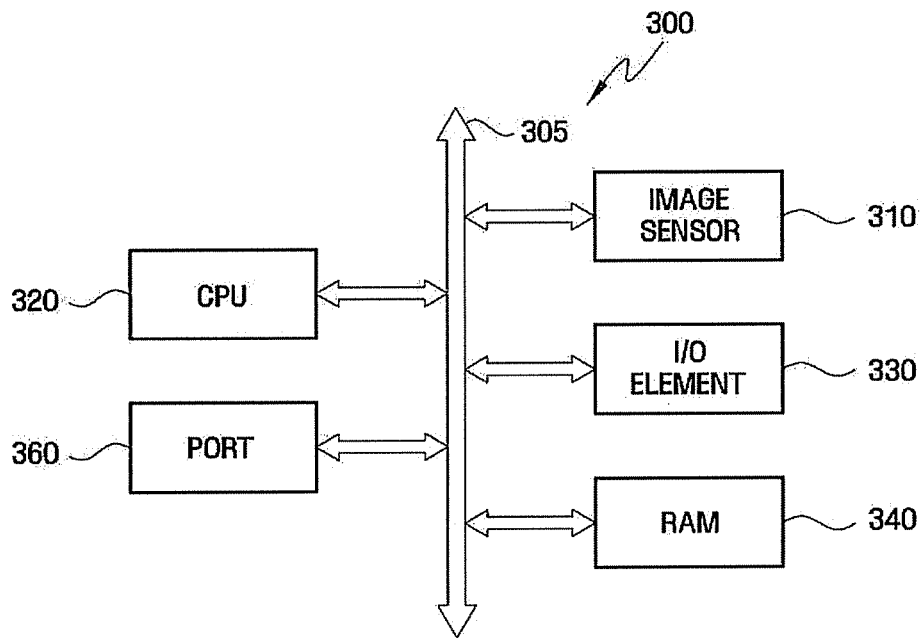
FIGS. 13 through 16 are diagrams illustrating processor-based apparatuses including an image sensor according to example embodiments of inventive concepts.
Figure 14:
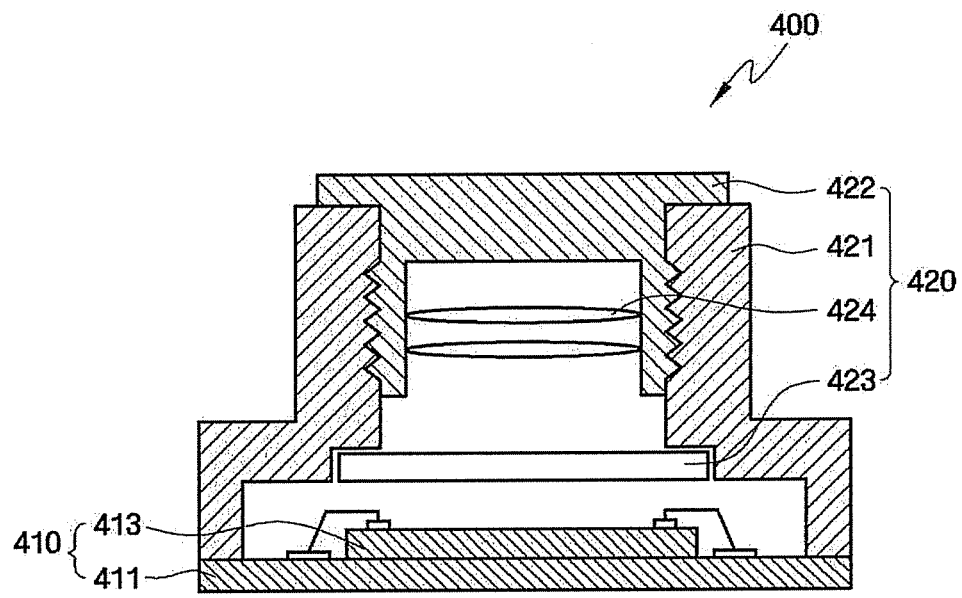
Figure 15:
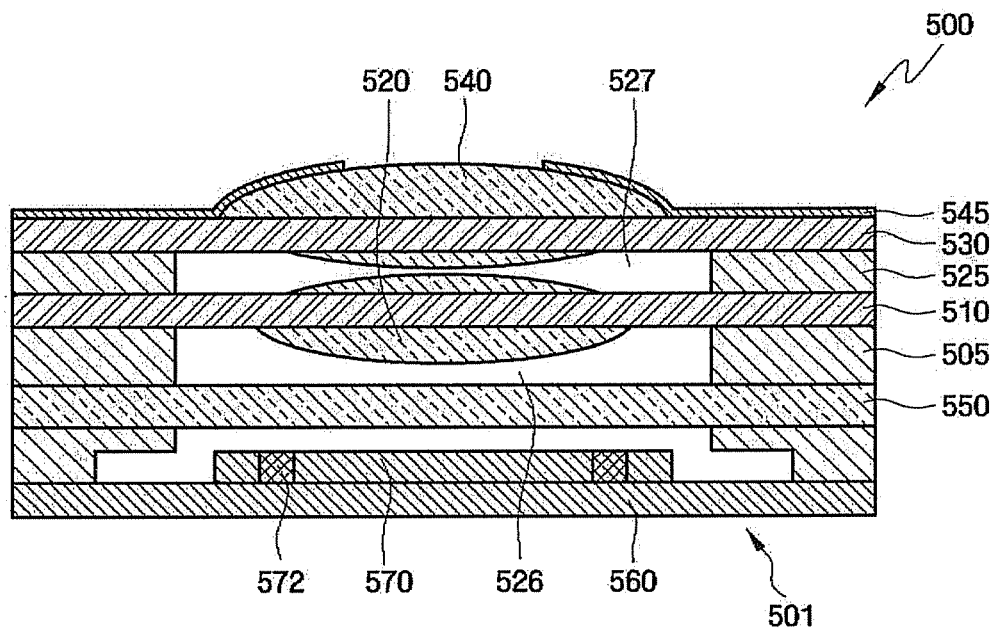
Figure 16:
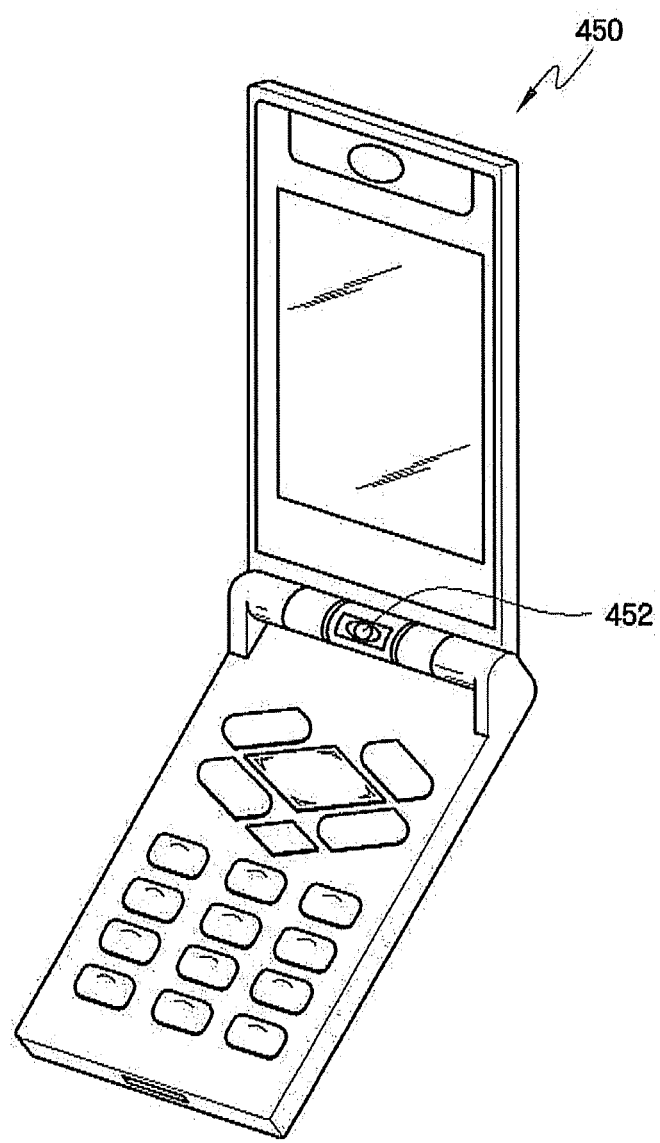

Hereinafter, apparatuses using an image sensor according to example embodiments of inventive concepts will be described with reference to FIGS. 12 through 16. FIG. 12 is a block diagram of a chip 200 which embodies an image sensor according to example embodiments of inventive concepts. FIGS. 13 through 16 are diagrams illustrating processor-based apparatuses including an image sensor according to example embodiments of inventive concepts. Specifically, FIG. 13 illustrates a computer 300, FIGS. 14 and 15 illustrate cameras 400 and 500, and FIG. 16 illustrates a mobile phone 450. It should be understood to those of ordinary skill in the art that an image sensor according to example embodiments of inventive concepts can be used in apparatuses (such as scanners, mechanized clock apparatuses, navigation apparatuses, videophones, surveillance apparatuses, automatic focusing apparatuses, tracking apparatuses, motion detection apparatuses, and image stabilization apparatuses) other than the above apparatuses.

Referring to FIG. 12, the chip 200 which embodies an image sensor according to example embodiments of inventive concepts includes a sensor array 210 composed of pixels which include light sensing elements and are arranged two-dimensionally, a timing generator 220, a row decoder 230, a row driver 240, a correlated double sampler (CDS) 250, an analog-to-digital converter (ADC) 260, a latch 270, and a column decoder 280.

The sensor array 210 includes a plurality of unit pixels that are arranged two-dimensionally. The unit pixels convert an optical image into an electrical signal. The sensor array 210 is driven by a plurality of driving signals (such as a row selection signal, a reset signal, and a charge transfer signal) transmitted from the row driver 240. In addition, the sensor array 210 transmits the electrical signal to the CDS 250 via a vertical signal line.

The timing generator 220 provides a timing signal and a control signal to the row decoder 230 and the column decoder 280.

The row driver 240 transmits a plurality of driving signals for driving the unit pixels to the sensor array 210 based on the decoding result of the row decoder 230. When the unit pixels are arranged in a matrix form, the row driver 240 may transmit a driving signal to each row of unit pixels.

The CDS 250 receives the electrical signal from the sensor array 210 via the vertical signal line and holds and samples the received electrical signal. That is, the CDS 250 samples a noise level and a signal level of the electrical signal and outputs the difference between the noise level and the signal level of the electrical signal.

The ADC 260 converts an analog signal, which corresponds to the difference between the noise level and the signal level of the electrical signal, into a digital signal and outputs the digital signal.

The latch 270 latches the digital signal. Latched signals are sequentially provided to an image signal processor (not shown) based on the decoding result of the column decoder 280.

All functional blocks illustrated in FIG. 9 may be fowled as one chip or a plurality of chips. For example, the timing generator 220 may be formed as a separate chip, and the other chips may be integrated into a single chip. Also, these chips may be implemented in the form of a package.

Referring to FIG. 13, the computer 300 includes a central processing unit (CPU) 320 (e.g., a microprocessor) which can communicate with an input/output element 330 via a bus 305. An image sensor 310 may communicate with the computer 300 through the bus 305 or any other telecommunication link. The computer 300 may further include a random access memory (RAM) 340 and/or a port 360 which can communicate with the CPU 320 through the bus 305. The port 360 may allow a video card, a sound card, a memory card, or a universal serial bus (USB) element to be coupled to the computer 300 and allow the computer 300 to perform data communication with other apparatuses. The image sensor 310 may be integrated together with the CPU 320, a digital signal processor (DSP), or a microprocessor. Also, the image sensor 310 may be integrated together with a memory. The image sensor 310 and those processors may be integrated on different chips.

Referring to FIG. 14, the camera 400 includes an image sensor package 410 in which an image sensor 413 is mounted onto a circuit board 411 by bonding wires. In addition, a housing 420 is attached onto the circuit board 411 and protects the circuit board 411 and the image sensor 413 from an external environment.

An optical tube assembly 421, through which an image to be captured passes, may be formed in the housing 420. Also, a protective cover 422 may be installed at an outer end of the optical tube assembly 421, and an infrared-blocking and reflection-preventing filter 423 may be installed at an inner end of the optical tube assembly 421. Further, a lens 424 may be installed inside the optical tube assembly 421 and move along the screw thread of the optical tube assembly 421.

Referring to FIG. 15, the camera 500 includes an image sensor package 501 which uses through vias 572. The through vias 572 enable an image sensor 570 and a circuit board 560 to electrically contact each other without wire bonding. A first lens 520, a second lens 540, lens components 526 and 527, a support member 505, an aperture 545, transparent substrates 510 and 530, a supporting member 525, and a pane of glass 550 shown in FIG. 15 will not be described.

Referring to FIG. 16, an image sensor 452 is attached to a predetermined position on the mobile phone 450. It should be understood to those of ordinary skill in the art that the image sensor 452 can also be attached to positions other than the position shown in FIG. 16.

While example embodiments have been particularly shown and described with reference to example embodiments thereof, it will be understood by those of ordinary skill in the art that various changes in form and detail may be made therein without departing from the spirit and scope of example embodiments as defined by the following claims. Example embodiments should be considered in a descriptive sense only and not for purposes of limitation.

What is claimed is:

1. An image sensor comprising:
a substrate including a visible light region and a non-visible light region;
a first well and a second well having a first conductivity type, the first well and the second well being in the non-visible light region;
a first gate and a second gate configured to receive voltages of opposite phases, respectively, concurrently and apply voltages to the first well and the second well, respectively; and
a photoelectric conversion element between the first gate and the second gate,
wherein the first gate and the second gate form a rake shape, the rake shape having a plurality of teeth such that the first gate and the second gate alternate.

2. The image sensor of claim 1, further comprising:
a third well between the first well and the second well in the substrate.

3. The image sensor of claim 2, further comprising:
a first barrier film having a second conductivity type, the first barrier film being along the third well.

4. The image sensor of claim 1, further comprising:
a first barrier film on the substrate, the first barrier film including a lower concentration of impurities than the first conductivity type.

5. The image sensor of claim 1, wherein the non-visible light region is configured to receive non-visible light having a longer wavelength than visible light.

6. The image sensor of claim 5, wherein the non-visible light is modulated.

7. The image sensor of claim 1, wherein the visible light region is between portions of the non-visible light region.

8. The image sensor of claim 7, wherein the non-visible light region has the rake shape or a spiral shape.

9. The image sensor of claim 1, wherein the first gate and the second gate are doped with impurities of a second conductivity type.

10. The image sensor of claim 1, wherein the visible light region includes a plurality of red color perception regions, a plurality of green color perception regions, and a plurality of blue color perception regions.

11. An image sensor comprising:
a substrate;
a first gate on or in the substrate and configured to receive a first signal;
a second gate on or in the substrate and configured to receive a second signal having an opposite phase of a phase of the first signal concurrently with the first gate receiving the first signal;
a first well having a first conductivity type and overlapped by the first gate;
a second well having the first conductivity type and overlapped by the second gate; and
a third well having the first conductivity type in the substrate,
wherein the first gate and the second gate form a rake shape, the rake shape having a plurality of teeth such that the first gate and the second gate alternate.

12. The image sensor of claim 11, further comprising:
a first barrier film having a second conductivity type along the third well in the substrate.

13. The image sensor of claim 11, further comprising:
a first barrier film on the substrate having a lower concentration of impurities than the first conductivity type.

14. The image sensor of claim 11, wherein the third well is between the first gate and the second gate.

15. The image sensor of claim 11, wherein an area of the first gate is equal to an area of the second gate.

16. The image sensor of claim 11, wherein the third well is between the first well and the second well.

17. The image sensor of claim 11, further comprising:
a black filter overlapping each of the first well and the second well and configured to block visible light.

18. The image sensor of claim 11, further comprising:
a color filter overlapping the third well.

19. The image sensor of claim 18, wherein the color filter comprises a white filter.

* * * * *